(12) United States Patent
Kim et al.

(10) Patent No.: US 9,570,699 B2
(45) Date of Patent: *Feb. 14, 2017

(54) ORGANIC LIGHT EMITTING DEVICE HAVING TRANSPARENT ELECTRODE WHERE CONDUCTING FILAMENTS FORMED AND METHOD OF MANUFACTURING THE SAME

(71) Applicant: KOREA UNIVERSITY RESEARCH AND BUSINESS FOUNDATION, Seoul (KR)

(72) Inventors: Tae Geun Kim, Seongnam-si (KR); Hee-Dong Kim, Seoul (KR)

(73) Assignee: KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/429,439

(22) PCT Filed: Jun. 5, 2013

(86) PCT No.: PCT/KR2013/004975
§ 371 (c)(1),
(2) Date: Mar. 19, 2015

(87) PCT Pub. No.: WO2014/046373
PCT Pub. Date: Mar. 27, 2014

(65) Prior Publication Data
US 2015/0214501 A1    Jul. 30, 2015

(30) Foreign Application Priority Data
Sep. 19, 2012 (KR) .................. 10-2012-0103754

(51) Int. Cl.
*H01L 51/52* (2006.01)
*H05B 33/26* (2006.01)
(Continued)

(52) U.S. Cl.
CPC .......... *H01L 51/5215* (2013.01); *B82Y 10/00* (2013.01); *H01L 51/0591* (2013.01);
(Continued)

(58) Field of Classification Search
CPC ............ H01L 51/5215; H01L 51/0048; H01L 51/0591; H01L 51/102; H01L 51/5012; H01L 51/5056; H01L 51/5072; H01L 51/5088; H01L 51/5092; H01L 51/52; H01L 51/5212; H01L 51/5234; H01L 51/56; H01L 2251/301; H01L 2251/305; H01L 2251/308; B82Y 10/00; H05B 33/26
See application file for complete search history.

(56) References Cited

U.S. PATENT DOCUMENTS

| | | | |
|---|---|---|---|
| 9,391,240 B2 * | 7/2016 | Kim | ......................... H01L 33/42 |
| 2006/0286889 A1 * | 12/2006 | Nishi | .................. H01L 27/3244 |
| | | | 445/24 |

(Continued)

FOREIGN PATENT DOCUMENTS

| | | |
|---|---|---|
| JP | 2002-324683 | 11/2002 |
| JP | 2003-173876 | 6/2003 |

(Continued)

OTHER PUBLICATIONS

Han, T. H. et al. Extremely efficient flexible organic light-emitting diodes with modified graphene anode. Nature Photonics, 6 (2012) 105-110.*

(Continued)

*Primary Examiner* — Robert Huber
*Assistant Examiner* — Gardner W Swan

(74) *Attorney, Agent, or Firm* — Kile Park Reed & Houtteman PLLC

(57) ABSTRACT

Provided is an organic light emitting device including a transparent electrode in which conducting filaments are formed and a method of manufacturing the same. In the organic light emitting device, a transparent electrode of an organic light emitting device is formed by using a resistance change material which has high transmittance with respect to light in a UV wavelength range and of which resistance state is to be changed from a high resistance state into a low resistance state due to conducting filaments, which current can flow through, formed in the material if a voltage exceeding a threshold voltage inherent in a material is applied to the material, so that it is possible to obtain the transparent electrode having high transmittance with respect to light in a UV wavelength range as well as light in a visible wavelength range generated by the organic light emitting device and having high conductivity.

24 Claims, 7 Drawing Sheets

(51) Int. Cl.
| | |
|---|---|
| *B82Y 10/00* | (2011.01) |
| *H01L 51/50* | (2006.01) |
| *H01L 51/56* | (2006.01) |
| *H01L 51/05* | (2006.01) |
| *H01L 51/10* | (2006.01) |
| *H01L 51/00* | (2006.01) |

(52) U.S. Cl.
CPC ........ *H01L 51/102* (2013.01); *H01L 51/5012* (2013.01); *H01L 51/5056* (2013.01); *H01L 51/5072* (2013.01); *H01L 51/5088* (2013.01); *H01L 51/5092* (2013.01); *H01L 51/5212* (2013.01); *H01L 51/5234* (2013.01); *H01L 51/56* (2013.01); *H05B 33/26* (2013.01); *H01L 51/0048* (2013.01); *H01L 51/52* (2013.01); *H01L 2251/301* (2013.01); *H01L 2251/305* (2013.01); *H01L 2251/308* (2013.01)

(56) References Cited

U.S. PATENT DOCUMENTS

| | | | | |
|---|---|---|---|---|
| 2011/0127497 A1* | 6/2011 | Choi | .................... | H01L 51/5206 257/40 |
| 2015/0171262 A1* | 6/2015 | Kim | ........................ | H01L 33/32 257/13 |
| 2015/0380579 A1* | 12/2015 | Kim | ....................... | H01L 51/444 257/431 |
| 2016/0005925 A1* | 1/2016 | Kim | ........................ | H01L 33/14 257/76 |

FOREIGN PATENT DOCUMENTS

| | | |
|---|---|---|
| JP | 2007-529906 | 10/2007 |
| KR | 10-2004-0000630 | 1/2004 |
| KR | 10-2009-0125341 | 12/2009 |
| KR | 10-2010-0077647 | 7/2010 |
| WO | 20051089288 | 9/2005 |

OTHER PUBLICATIONS

International Search Report for International Application No. PCT/KR2013/004975 dated, Sep. 12, 2013.
Congli He et al., "Multilevel Resistive Switching in Planar Graphene/SiO2 Nanogap Structures", ACS Nano, vol. 6, No. 5, 2012, pp. 4214-4221.

* cited by examiner

ORGANIC LIGHT EMITTING DEVICE HAVING TRANSPARENT ELECTRODE WHERE CONDUCTING FILAMENTS FORMED AND METHOD OF MANUFACTURING THE SAME

BACKGROUND OF THE INVENTION

1. Field of the Invention

The present invention relates to an organic light emitting device and a method of manufacturing the organic light emitting device, and more particularly, to an organic light emitting device including a transparent electrode having good ohmic contact characteristic and high transmittance and a method of manufacturing the organic light emitting device.

2. Description of the Related Art

Recently, in response to the government's low-carbon green growth policy stance, semiconductor illumination using LEDs (light emitting diodes) and OLEDs (organic light emitting diodes) as semiconductor light sources has attracted much attention. The semiconductor illumination is environment-friendly illumination which does not use hazardous substances such as mercury and lead, and the semiconductor illumination is also low-power-consumption illumination of which power efficiency is much higher than that of traditional illumination. In particular, unlike the LED as a point light source, the OLED has a structure of thin planar light source, so that it is possible to implement transparent and flexible illumination, which cannot be easily implemented in the traditional light sources.

In addition, since the OLED illumination as transparent, flexible illumination can be used for applications such as new-concept smart window illumination, portable rolled-up illumination like a scroll, and curtain illumination, the OLED illumination has been more actively researched.

However, in order for the OLED to be used for various applications, the problem of high driving voltage of the OLED caused by bad ohmic characteristic between a transparent electrode and an organic semiconductor layer needs to be solved. The driving voltage of the OLED is mainly determined by injection and movement of electric charges. Therefore, two characteristics of the injection and movement of electric charges need to be improved in order to improve the driving voltage.

Since the charge injection characteristic is determined by energy potential between the transparent electrode and the organic semiconductor layer, the ohmic contact is formed by reducing a difference in energy barrier between the transparent electrode and the organic semiconductor layer, so that the injection and movement of the electric charges can be effectively performed. Therefore, the OLED having a low driving voltage can be implemented.

However, in the current OLED, due to a large difference in work function between ITO (4.3 eV) mainly used for a transparent electrode and an organic semiconductor (6.3 eV), the ohmic characteristic is bad, so that there is a problem in that charge injection efficiency is low. In addition, since ITO has large transmission loss in a UV wavelength range, in the current organic UV-LED, there is a problem in that light extraction efficiency is low.

In order to solve the above-mentioned problems, the ITO used for a transparent electrode and the organic semiconductor are allowed to be ohmic contact with each other so that charge injection is efficiently performed. However, transmittance and conductivity of a transparent electrode currently generally used is in Trade-off relationship. Namely, since a material having high transmittance in a UV wavelength range has a large band gap, the conductivity thereof is too low to be used as an electrode, and since the material is not in ohmic contact with a semiconductor material, it is impossible to use the above material as an electrode.

In the related art, a transparent electrode having high transmittance with respect to light in a UV wavelength range as well in a visible wavelength range and high conductivity due to good ohmic contact cannot be implemented. Therefore, in order to implement OLEDs which can be applied to a UV wavelength range as well as a visible wavelength range, the transparent electrode having high transmittance and good ohmic contact with an organic semiconductor layer needs to be developed.

SUMMARY OF THE INVENTION

The present invention is to provide an organic light emitting device including a transparent electrode having high transmittance with respect to light in a UV wavelength range as well in a visible wavelength range and good ohmic contact characteristic with respect to an organic semiconductor layer and a method of manufacturing the organic light emitting device.

According to an aspect of the present invention, there is provided an organic light emitting device including: a substrate; a first electrode which is formed on the substrate by using a transparent insulating material of which resistance state is changed from a high resistance state into a low resistance state according to an applied electric field; an organic material layer which is formed on the first electrode and includes a light emitting layer; and a second electrode which is formed on the organic material layer.

According to another aspect of the present invention, there is provided an organic light emitting device including: a substrate; a second electrode which is formed on the substrate; an organic material layer which is formed on the second electrode and includes a light emitting layer; and a first electrode which is formed on the organic material layer by using a transparent insulating material of which resistance state is changed from a high resistance state into a low resistance state according to an applied electric field.

In the above aspects, a forming process may be performed on the first electrode by applying a threshold voltage or more inherent in a material of the first electrode, so that conducting filaments are formed in the first electrode.

In addition, in the above aspects, the organic light emitting device may further include a current spreading layer which is formed by using CNT (carbon nano tube) or graphene between the organic material layer and the first electrode.

In addition, in the above aspects, the organic light emitting device may further include a current spreading layer which formed by using CNT or graphene and is in contact with a surface of the first electrode opposite to a surface of the first electrode which is in contact with the organic material layer.

In addition, in the above aspects, the first electrode may be in ohmic contact with the organic material layer.

In addition, in the above aspects, the first electrode may be formed by using any one of a transparent oxide based material, a transparent nitride based material, a transparent polymer based material, and a transparent nano material.

In addition, in the above aspects, the organic material layer may be configured to include a hole injection layer, a hole transport layer, a light emitting layer, an electron transport layer, and an electron injection layer.

According to still another aspect of the present invention, there is provided a method of manufacturing an organic light emitting device, including: forming a first electrode on a substrate by using a transparent insulating material of which resistance state is to be changed from a high resistance state into a low resistance state according to an applied electric field; forming an organic material layer including a light emitting layer on the first electrode; and forming a second electrode on the organic material layer.

According to further still another aspect of the present invention, there is provided a method of manufacturing an organic light emitting device, including: forming a second electrode on a substrate; forming an organic material layer including a light emitting layer on the second electrode; and forming a first electrode on the organic material layer by using a transparent insulating material of which resistance state is to be changed from a high resistance state into a low resistance state according to an applied electric field.

In the above aspects, in the forming of the first electrode, a forming process may be performed by applying a threshold voltage or more to the first electrode, so that conducting filaments are formed in the first electrode.

In addition, in the above aspects, the forming of the first electrode may include forming a current spreading layer by using CNT or graphene; forming the first electrode on the current spreading layer by using a transparent insulating material of which resistance state is to be changed from a high resistance state into a low resistance state by an applied electric field; and forming conducting filaments in the first electrode by performing a forming process by applying a threshold voltage or more to the first electrode.

In addition, in the above aspects, the forming of the first electrode may include forming the first electrode by using the transparent insulating material of which resistance state is to be changed from a high resistance state into a low resistance state according to an applied electric field; forming the conducting filaments in the first electrode by performing a forming process by applying a threshold voltage or more to the first electrode; and forming a current spreading layer on the first electrode by using CNT or graphene.

In addition, in the above aspects, the first electrode may be in ohmic contact with the organic material layer.

In addition, in the above aspects, the first electrode may be formed by using any one of a transparent oxide based material, a transparent nitride based material, a transparent polymer based material, and a transparent nano material.

In addition, in the above aspects, in the forming of the organic material layer, a hole injection layer, a hole transport layer, a light emitting layer, an electron transport layer, and an electron injection layer may be sequentially formed.

According to the present invention, a transparent electrode of an organic light emitting device is formed by using a resistance change material which has high transmittance with respect to light in a UV wavelength range and of which resistance state is to be changed from a high resistance state into a low resistance state due to conducting filaments, which current can flow through, formed in the material if a voltage exceeding a threshold voltage inherent in a material is applied to the material, so that it is possible to obtain the transparent electrode having high transmittance with respect to light in a UV wavelength range as well as light in a visible wavelength range generated by the organic light emitting device and having high conductivity due to good ohmic contact characteristic with respect to an organic material layer constituting an organic semiconductor layer, and thus, it is possible to decrease a driving voltage.

In addition, according to the present invention, a current spreading layer formed by using CNT or graphene having good ohmic contact characteristic and high transmittance is formed on an upper or lower portion of a transparent electrode to connect conducting filaments formed in the transparent electrode, so that current flowing into the transparent electrode is allowed to spread through the entire organic material layer, and thus, it is possible to prevent the problem of current concentration from occurring.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Hereinafter, exemplary embodiments of the present invention will be described with reference to the attached drawings.

Figure 1:
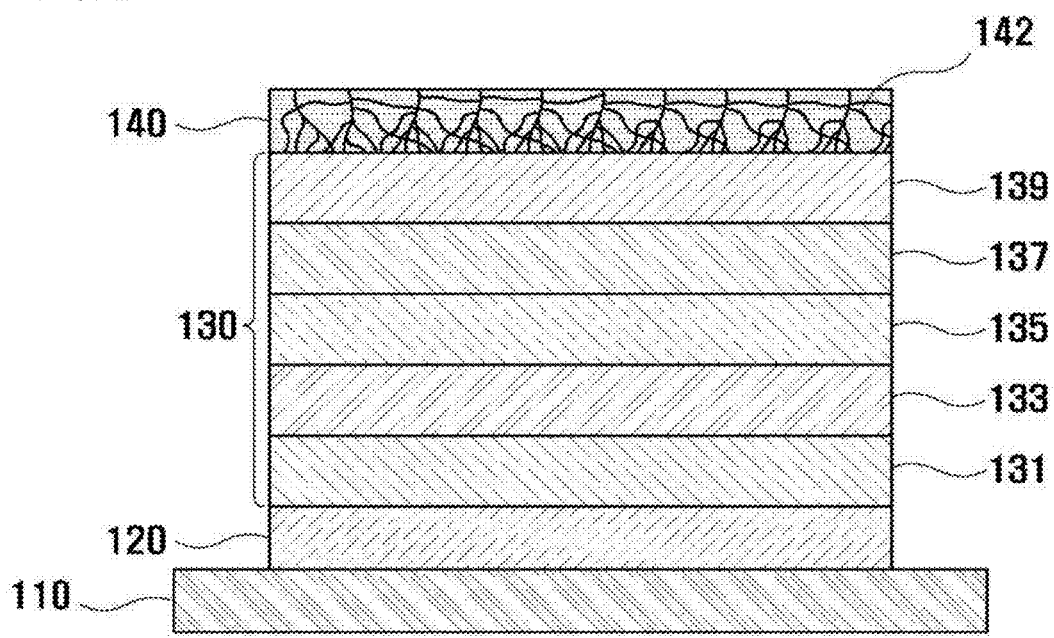
FIG. 1 is a diagram illustrating a configuration of an organic light emitting device including a transparent electrode according to a first embodiment of the present invention.

FIG. 1 is a diagram illustrating a configuration of an organic light emitting device including a transparent electrode 140 according to a first embodiment of the present invention.

Referring to FIG. 1, an organic light emitting device according to the first embodiment of the present invention is a top-emission type organic light emitting device. In the organic light emitting device, a second electrode 120 and an organic material layer 130 including a light emitting layer 135 are sequentially formed on a substrate 110, and the organic material layer 130 is configured by sequentially forming a hole injection layer 131, a hole transport layer 133, the light emitting layer 135, an electron transport layer 137, and an electron injection layer 139. Hereinafter, the case where the organic material layer 130 includes the hole injection layer 131 to the electron injection layer 139 will be described as an example. The configurations from the substrate 110 to the electron injection layer 139 may be the same as those of all the organic light emitting devices which are currently known in the related art.

A first electrode 140 (hereinafter, referred to as a "transparent electrode") formed with a transparent material according to the present invention is formed on the electron injection layer 139. The transparent electrode 140 according to the present invention is formed by using a transparent insulating material (resistance change material) which has high transmittance with respect to light in a UV wavelength range and of which resistance state is to be changed according to an applied electric field. The resistance change material is mainly used in the field of ReRAM (resistive RAM). If a threshold voltage or more inherent in the material is applied to the material, electro-forming is performed, the resistance state of the resistance change material which is originally an insulating material is changed from a high resistance state into a low resistance state, so that the material has a conductivity.

More specifically, if a threshold voltage or more is applied to the resistance change material which is an insulating material, electrode metal materials are diffused into a thin film due to electric stress (i.e., forming process), or a defective structure occurs in the thin film, so that conducting filaments 142 (or, metallic filaments) are formed in the resistance change material as illustrated in FIG. 1. After that, although the voltage applied to the material is removed, the conducting filaments 142 remain, and current can flow through the conducting filaments 142, so that the low resistance state of the material is maintained.

Figure 2A:
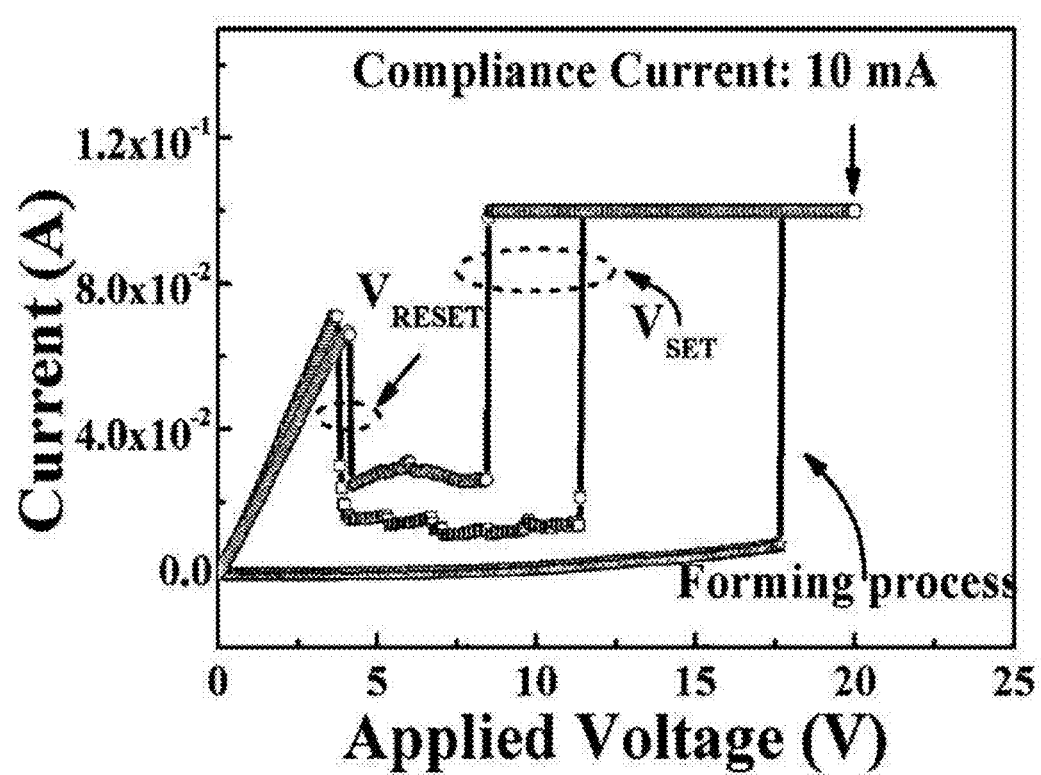
FIGS. 2a and 2b are graphs illustrating characteristics of a resistance change material.
Figure 2B:
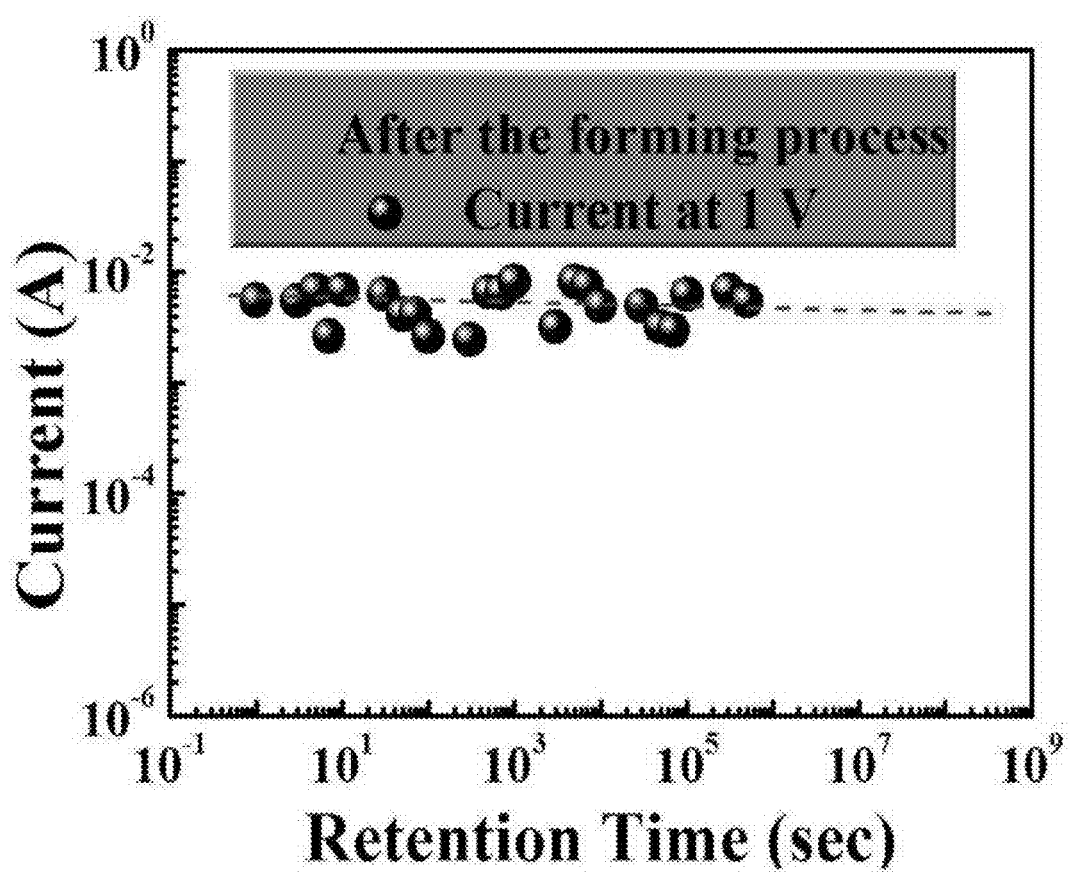

FIGS. 2a and 2b are graphs illustrating characteristics of a resistance change material.

Referring to FIG. 2a, it can be seen that the resistance change material (for example, AlN) has an insulating characteristic before the forming process and has an I-V characteristic of a metal after the forming process.

FIG. 2b is a graph illustrating how long the resistance state can be stably maintained after the conducting filaments 142 are formed. It can be seen from a dotted line in the graph that the low resistance state can be stably maintained for ten years after the conducting filaments 142 are formed.

In the embodiment of the present invention, a transparent conductive oxide based material ($SiO_2$, $Ga_2O_3$, $Al_2O_3$, ZnO, ITO, or the like), a transparent conductive nitride based material ($Si_3N_4$, AlN, GaN, InN, or the like), a transparent conductive polymer based material (polyaniline(PANI)), poly(ethylenedioxythiophene)-polystyrene sulfonate (PEDOT: PSS) or the like), and a transparent conductive nano material (CNT, CNT-oxide, Graphene, Graphene-oxide, or the like) or the like may be used as the resistance change material. In addition to the above-described materials, any material which is transparent and has the above-described resistance change characteristic can be used to form the transparent electrode 140 according to the present invention. It should be noted that the statement that the material has conductivity denotes that the material is allowed to have conductivity as a result of the forming process by which the conducting filaments 142 are formed in the transparent electrode. In addition, it should be noted that the forming process is performed on the transparent electrode 140 according to the present invention, so that the conducting filaments are formed in the transparent electrode.

As illustrated in FIG. 1, if the organic light emitting device is completed, current into the transparent electrode 140 is allowed to spread through the conducting filaments 142, which are connected to each other in the transparent electrode 140, over the entire area to be injected into the entire electron injection layer 139. The light generated in the light emitting layer 135 including the light in a UV wavelength range is emitted through the transparent electrode 140 having a large band gap to an external portion.

Figure 3:
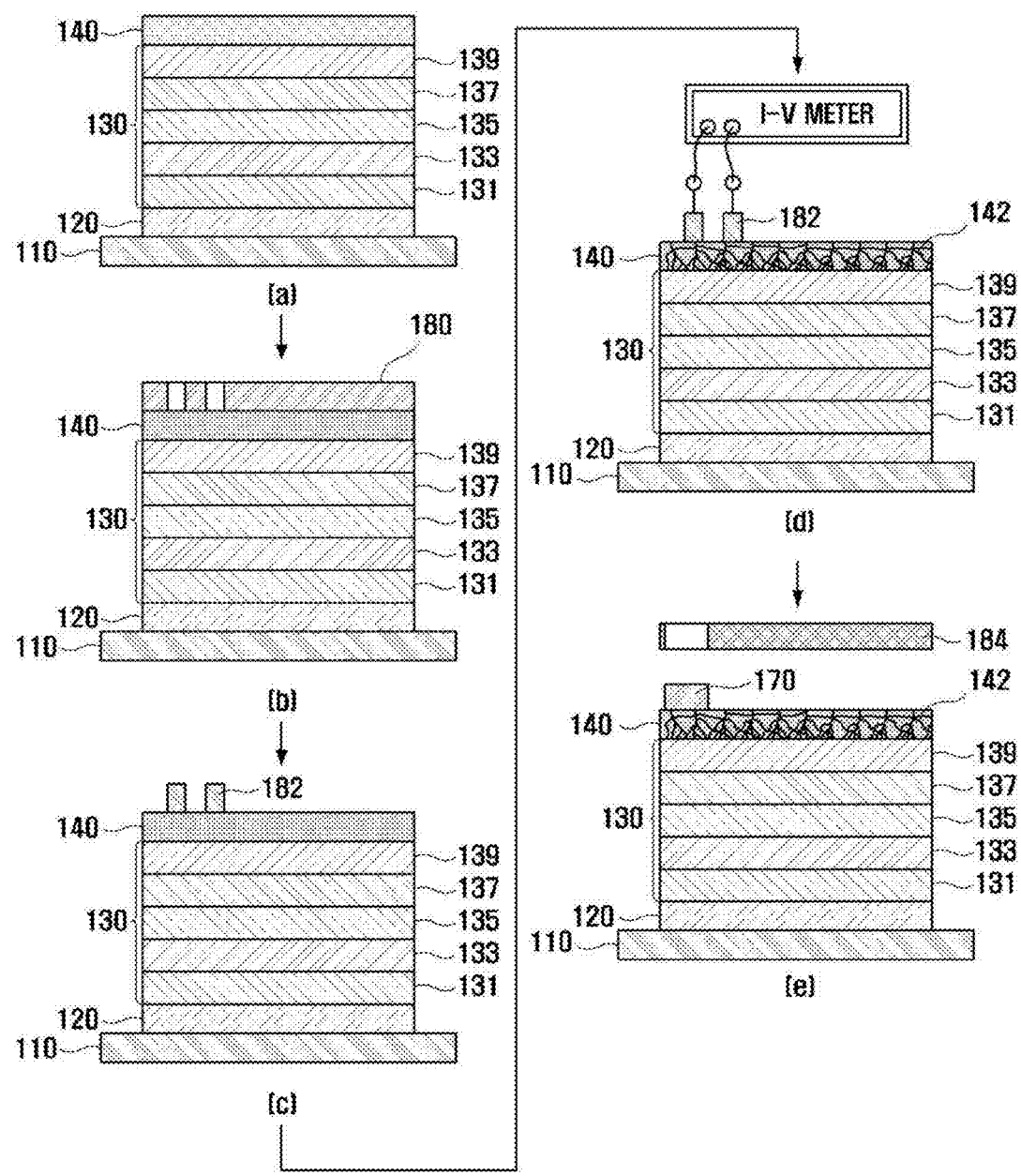
FIG. 3 is a diagram illustrating a method of manufacturing the organic light emitting device according to the first embodiment of the present invention.

FIG. 3 is a diagram illustrating a method of manufacturing the organic light emitting device according to the first embodiment of the present invention.

The method of manufacturing the organic light emitting device according to the first embodiment of the present invention will be described with reference to FIG. 3. First, by using the same method as a method of manufacturing an organic light emitting device in the related art, a second electrode 120 and an organic material layer 130 including a light emitting layer 135 are formed on a substrate 110 (refer to (a) of FIG. 3). As described above, the organic material layer 130 can be configured by sequentially forming the hole injection layer 131, the hole transport layer 133, the light emitting layer 135, the electron transport layer 137, and the electron injection layer 139. By using the same method as a method of forming a transparent electrode in the related art, as described above, the first electrode 140 (hereinafter, referred to as a "transparent electrode") can be formed with a resistance change material on the organic material layer 130 (particularly, the electron injection layer 139).

Next, a photoresist layer 180 is formed on the transparent electrode 140, and a pattern for forming the forming electrode 182 is formed on a portion of the area of the photoresist layer 180 where a metal pad 170 is to be formed by performing a photolithography process (refer to (b) of FIG. 3).

Next, by performing an e-beam process, a sputtering process, or other metal deposition processes, the forming electrode 182 is formed in the pattern. Next, the forming electrode 182 is completed by removing the photoresist layer 180 except for the forming electrode 182 through a lift-off process (refer to (c) of FIG. 3).

Next, as illustrated in (d) of FIG. 3, if a threshold voltage or more inherent in the material is applied to the forming electrode 182 formed on the transparent electrode 140, conducting filaments 142 are formed in the transparent electrode 140 which is an insulating material, so that the resistance state of the transparent electrode 140 is changed from a high resistance state into a low resistance state.

After the conducting filaments 142 are formed in the transparent electrode 140, a metal electrode pad 170 is formed on the transparent electrode 140 (refer to (e) of FIG. 3). At this time, as a method of forming the metal electrode pad 170, the forming electrode 182 for performing the forming process may be removed, and a separate metal electrode pad 170 may be formed. Alternatively, as illustrated in (e) of FIG. 3, metal is additionally deposited on the forming electrode 182 by using a mask 184, so that the metal electrode pad 170 may be formed.

Hereinbefore, the organic light emitting device according to the first embodiment of the present invention and the method of manufacturing the organic light emitting device are described.

In the first embodiment described above with reference to FIGS. 1 to 3, some conducting filaments 142 formed in the transparent electrode 140 may not be connected to other conducting filaments 142. In this case, current flowing into the transparent electrode 140 may not spread over the entire transparent electrode 140 but be concentrated to be localized, so that a problem of current concentration that current is concentrated to be localized on the electron injection layer 139 which is in contact with the transparent electrode 140 may occur.

Figure 4A:
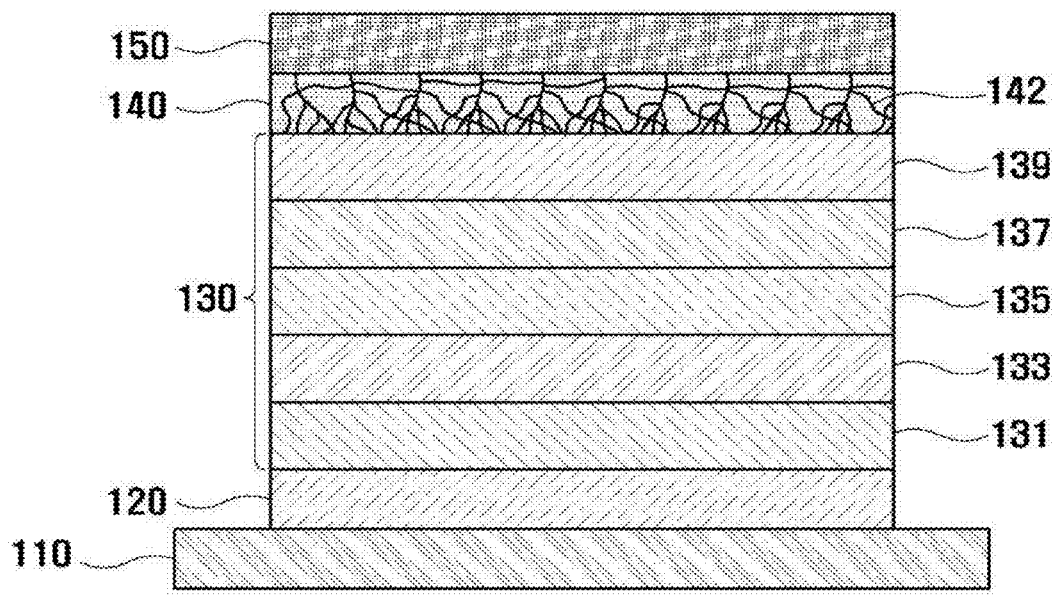
FIGS. 4a and 4b are diagrams illustrating configurations of organic light emitting devices according to modified examples of the first embodiment of the present invention in order to solve the problem of current concentration.
Figure 4B:
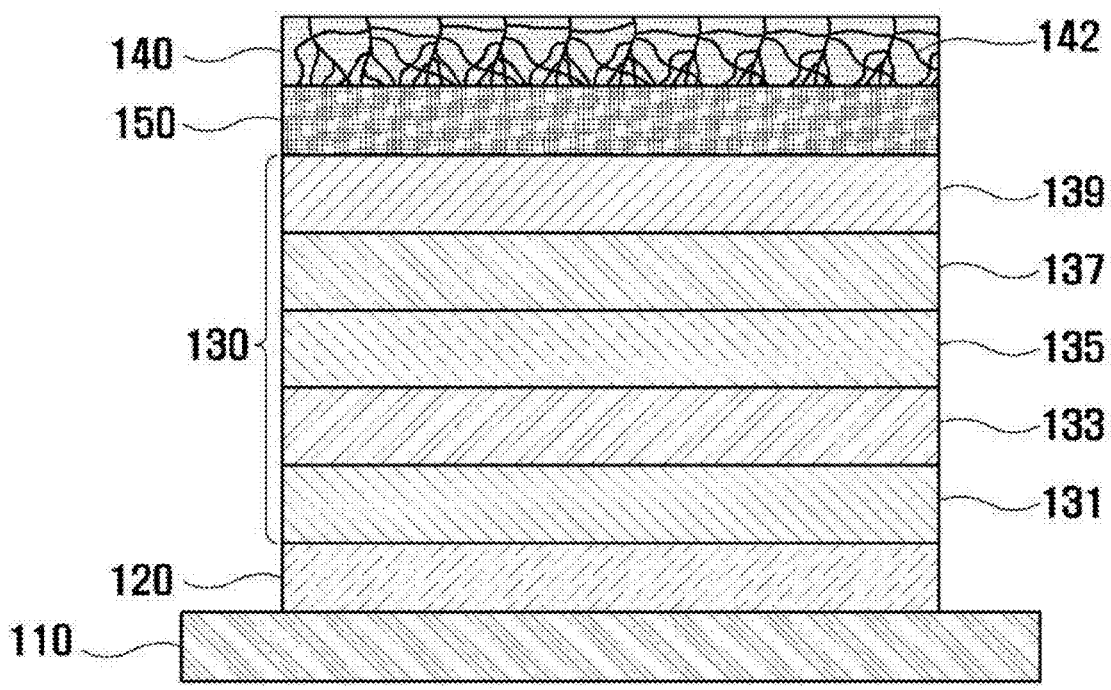

FIGS. 4a and 4b are diagrams illustrating configurations of organic light emitting devices according to modified examples of the first embodiment of the present invention in order to solve the problem of current concentration.

In the examples illustrated in FIGS. 4a and 4b, in order to improve the current spreading characteristic of the transparent electrode 140, a current spreading layer 150 formed by using CNT (carbon nano tube) or graphene which connects the conducting filaments 142 formed on the transparent electrode 140 is formed on an upper surface or a lower surface of the transparent electrode 140.

FIG. 4a illustrates an example where the current spreading layer 150 formed by using CNT or graphene is formed on the transparent electrode 140. FIG. 4b illustrates an example where the current spreading layer 150 formed by using CNT or graphene is formed between the transparent electrode 140 and the electron injection layer 139.

The CNT and the graphene have good conductivity and transmittance characteristics. In the present invention, the conducting filaments 142 in the transparent electrode 140 are connected to each other by forming the current spreading layer 150 by using CNT or graphene on one surface of the transparent electrode 140 by using the characteristics, so that the current flowing into the transparent electrode 140 can be allowed to spread over the entire electron injection layer 139.

At this time, as the thickness of the current spreading layer 150 is increased, the CNTs or graphenes in the current spreading layer 150 are connected to each other, and thus, the possibility that the conducting filaments 142 are connected to each other is increased. As a result, the conductivity of the transparent electrode 140 is increased, but the transmittance thereof is decreased. Therefore, it is preferable that the current spreading layer 150 according to the present invention is formed with a thickness enough to connect the conducting filaments 142 in the transparent electrode 140 to each other and as thin as possible within a range where the transmittance is not deteriorated.

In the embodiment of the present invention illustrated in FIGS. 4a and 4b, the current spreading layer 150 is formed with a thickness of about 2 nm to about 100 nm.

The thickness of 2 nm is a minimum thickness so that a single layer of CNT or graphene can be formed, and the thickness of 100 nm is a maximum thickness so that transmittance can be maintained to be 80% or more.

The configurations of the examples illustrated in FIGS. 4a and 4b are the same as those of the example described with reference to FIGS. 1 to 3, except that the current spreading layer 150 is formed by using CNT or graphene just before or after the transparent electrode 140 is formed, and thus, the detailed description thereof is omitted.

Figure 5:
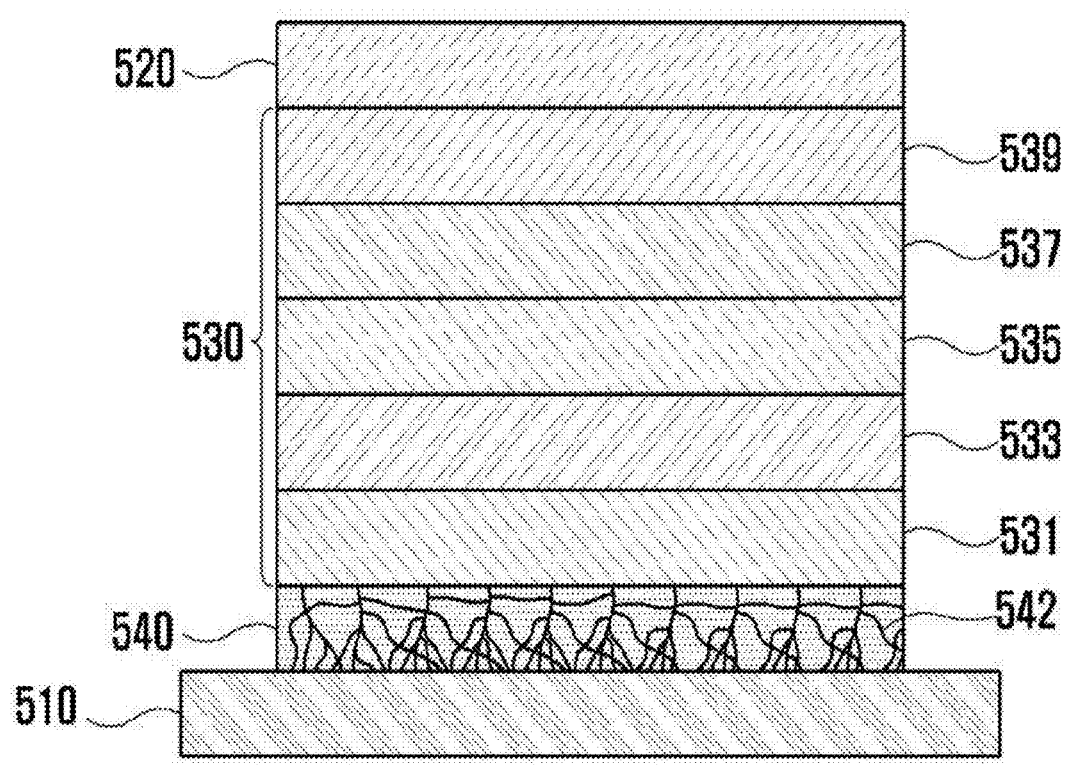
FIG. 5 is a diagram illustrating a configuration of an organic light emitting device including a transparent electrode according to a second embodiment of the present invention.

FIG. 5 is a diagram illustrating a configuration of an organic light emitting device including a transparent electrode 540 according to a second embodiment of the present invention.

Referring to FIG. 5, an organic light emitting device according to the second embodiment of the present invention is a bottom-emission type organic light emitting device. In the organic light emitting device, a first electrode 540 (hereinafter, referred to as a "transparent electrode") is formed on a substrate 510 constructed with a transparent glass or a transparent plastic material, and an organic material layer 530 including a light emitting layer 535 and a second electrode 520 are sequentially formed on the transparent electrode 540. The organic material layer 530 can be configured by sequentially forming a hole injection layer 531, a hole transport layer 533, a light emitting layer 535, an electron transport layer 537, and an electron injection layer 539. Hereinafter, the configuration will be described as an example. The configuration of the transparent substrate 510 and the configurations from the hole injection layer 531 to the second electrode 520 may be the same as those of a general bottom-emission type organic light emitting device in the related art.

On the other hand, similarly to the above-described transparent electrode 140 according to the first embodiment, the transparent electrode 540 formed on the transparent substrate 510 is constructed with a resistance change material, and the conducting filaments 540 is formed in the transparent electrode 540 by performing the forming process. The conducting filaments 542 are connected to each other, so that the low resistance state is maintained. Therefore, the transparent electrode 540 has very high transmittance with respect to light in a UV wavelength range as well as in a visible wavelength range, and the transparent electrode 540 is also in ohmic contact with the hole injection layer 531, so that the driving power of the organic light emitting device is decreased.

Figure 6:
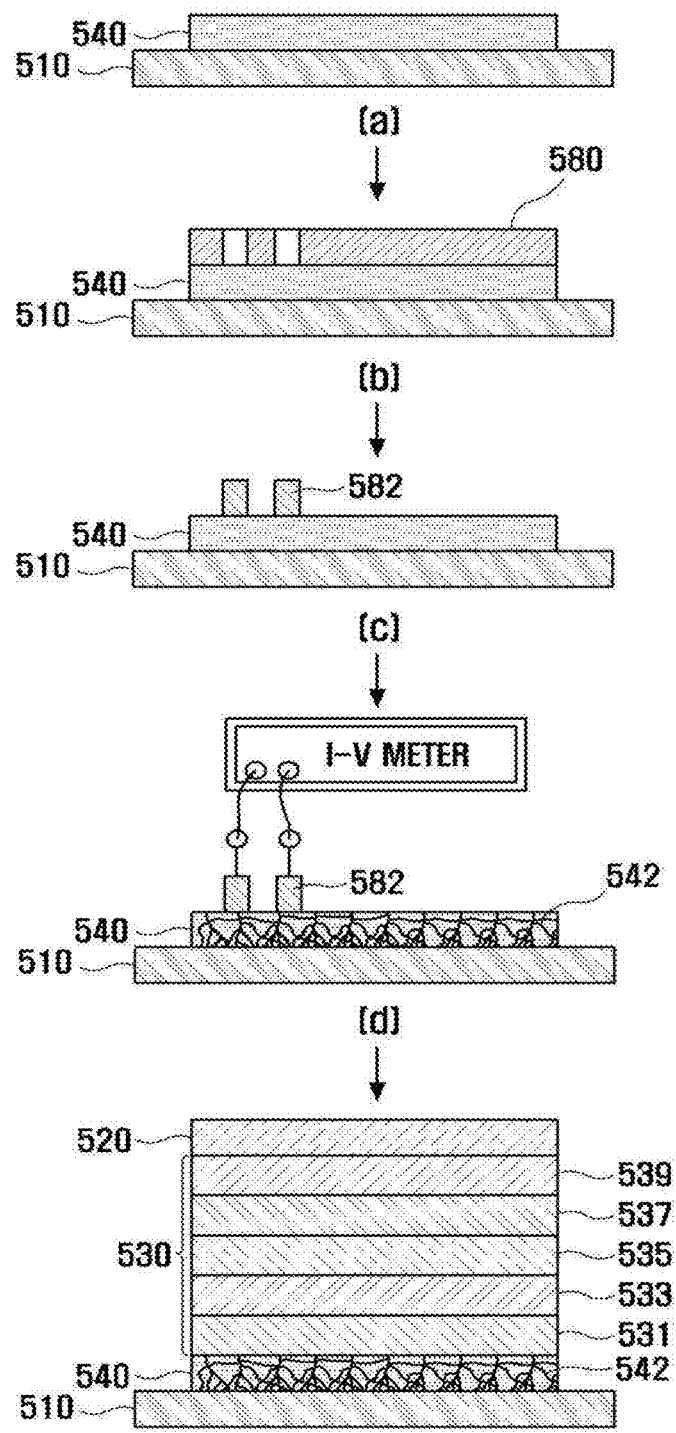
FIG. 6 is a diagram illustrating a method of manufacturing the organic light emitting device according to the second embodiment of the present invention.

FIG. 6 is a diagram illustrating a method of manufacturing the organic light emitting device according to the second embodiment of the present invention.

The method of manufacturing the organic light emitting device according to the second embodiment of the present invention will be described with reference to FIG. 6. First, a transparent electrode 540 (first electrode) is formed with a resistance change material on a substrate 510 such as the above-described transparent glass substrate or transparent plastic substrate 510 which is generally used for manufacturing a bottom-emission type organic light emitting device (refer to (a) of FIG. 6).

Next, a photoresist layer 580 is formed on the transparent electrode 540, and a pattern for forming the forming electrode 582 is formed on the photoresist layer 580 by performing a photolithography process (refer to (b) FIG. 6). Next, by performing an e-beam process, a sputtering process, or other metal deposition processes, the forming electrode 582 is formed in the pattern. Next, the forming electrode 582 is completed by removing the photoresist layer 580 except for the forming electrode 582 through a lift-off process (refer to (c) of FIG. 5).

Next, as illustrated in (d) of FIG. 6, if a threshold voltage or more inherent in the material is applied to the forming electrode 582 formed on the transparent electrode 540, conducting filaments 542 are formed in the transparent electrode 540 which is an insulating material, so that the resistance state of the transparent electrode 540 is changed from a high resistance state into a low resistance state.

After the forming process is performed on the transparent electrode 540, a hole injection layer 531, a hole transport layer 533, a light emitting layer 535, an electron transport layer 537, an electron injection layer 539, and a second electrode 520 are sequentially formed on the transparent electrode 540 (refer to (e) of FIG. 6). The processes of forming the hole injection layer 531 to the second electrode 520 are the same as those in a method of manufacturing a bottom-emission type organic light emitting device in the related art.

Figure 7A:
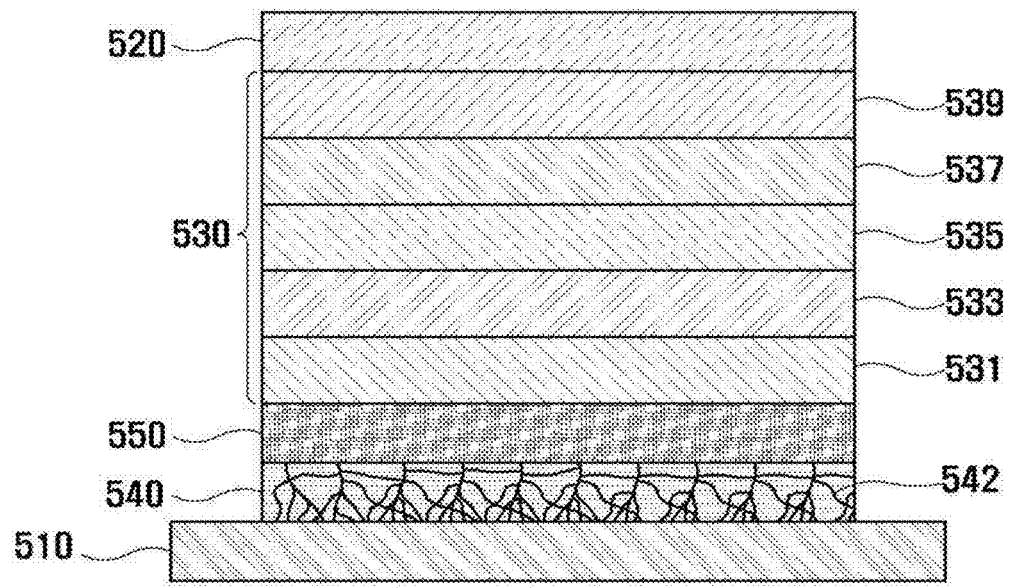
FIGS. 7a and 7b are diagrams illustrating configurations of organic light emitting devices according to modified examples of the second embodiment of the present invention.
Figure 7B:
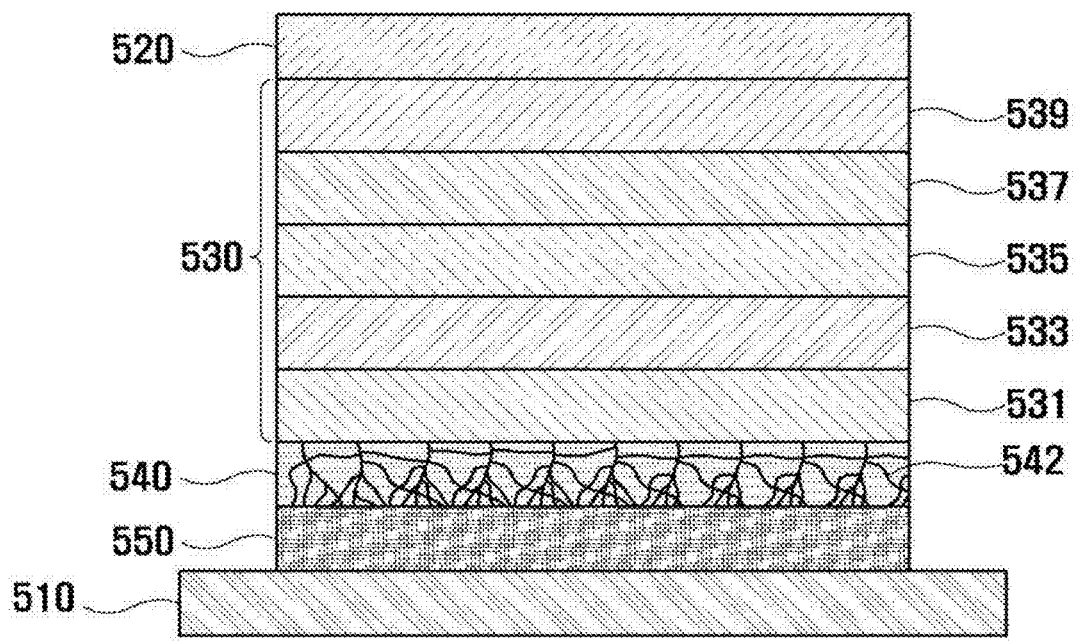

FIGS. 7a and 7b are diagrams illustrating configurations of organic light emitting devices according to modified examples of the second embodiment of the present invention. Similarly to the modified examples of the first embodiment illustrated in FIGS. 4a and 4b, in the modified examples of the second embodiment illustrated in FIGS. 7a and 7b, in order to improve the current spreading efficiency, a current spreading layer 550 is formed by using CNT or graphene so as to be in contact with an upper or lower surface of the transparent electrode 540. FIG. 7*a* illustrates the example where the current spreading layer 550 is formed on the transparent electrode 540. FIG. 7*b* illustrates the example where the current spreading layer 550 is formed on the transparent substrate 510, and the transparent electrode 540 is formed on the current spreading layer 550.

In the example illustrated in FIG. 7*a*, holes are primarily allowed to spread into the entire area of the organic light emitting device to be injected into the transparent electrode 540 by the current spreading layer 550, and the holes are secondarily allowed to spread into the entire area of the organic light emitting device by the transparent electrode 540, so that the holes are uniformly injected into the hole injection layer 531. In the example illustrated in FIG. 7*b*, the holes are primarily allowed to spread into the entire area of the organic light emitting device to be injected into the current spreading layer 550 by the transparent electrode 540, and the holes are secondarily allowed to spread into the entire area of the organic light emitting device by the current spreading layer 550, so that the holes are uniformly injected into the hole injection layer 531.

The processes of the method of manufacturing the organic light emitting device including the current spreading layer 550 are the same as those of the above-described method of manufacturing the organic light emitting device except that the current spreading layer 550 is formed before or after the formation of the transparent electrode 540, and thus, the detailed description thereof is omitted.

While the present invention has been particularly shown and described with reference to exemplary embodiments thereof, it will be understood by those skilled in the art that various changes in form and details may be made therein without departing from the spirit and scope of the invention as defined by the appended claims. The exemplary embodiments should be considered in descriptive sense only and not for purposes of limitation. Therefore, the scope of the invention is defined not by the detailed description of the invention but by the appended claims, and all differences within the scope will be construed as being included in the present invention.

What is claimed is:

1. An organic light emitting device comprising:
   a substrate;
   a first electrode which is formed on the substrate by using a transparent resistance change material of which a resistance state is changed from a high resistance state into a low resistance state according to an applied electric field;
   an organic material layer which is formed on the first electrode and includes a light emitting layer; and
   a second electrode which is formed on the organic material layer;
   wherein the transparent resistance change material includes an insulating portion;
   wherein the transparent resistance change material of the first electrode has an inherent threshold voltage at which conducting filaments of the resistance change material are formed through the insulating portion of the resistance change material in the first electrode, and
   wherein the conducting filaments are formed by a process performed on the first electrode, the process comprising applying at least the threshold voltage to the first electrode to change the resistance state into the low resistance state.

2. The organic light emitting device according to claim 1, further comprising a current spreading layer which is formed by using CNT (carbon nano tube) or graphene between the organic material layer and the first electrode.

3. The organic light emitting device according to claim 1, further comprising a current spreading layer which formed by using CNT or graphene and is in contact with a surface of the first electrode opposite to a surface of the first electrode which is in contact with the organic material layer.

4. The organic light emitting device according to claim 1, wherein the first electrode is in ohmic contact with the organic material layer.

5. The organic light emitting device according to claim 1, wherein the first electrode is formed by using any one of a transparent oxide based material, a transparent nitride based material, a transparent polymer based material, and a transparent nano material.

6. The organic light emitting device according to claim 1, wherein the organic material layer is configured to include a hole injection layer, a hole transport layer, a light emitting layer, an electron transport layer, and an electron injection layer.

7. An organic light emitting device comprising:
   a substrate;
   a second electrode which is formed on the substrate;
   an organic material layer which is formed on the second electrode and includes a light emitting layer; and
   a first electrode which is formed on the organic material layer by using a transparent resistance change material of which a resistance state is changed from a high resistance state into a low resistance state according to an applied electric field;
   wherein the transparent resistance change material includes an insulating portion;
   wherein the transparent resistance change material of the first electrode has an inherent threshold voltage at which conducting filaments of the resistance change material are formed through the insulating portion of the resistance change material in the first electrode, and
   wherein the conducting filaments are formed by a process performed on the first electrode, the process comprising applying at least the threshold voltage to the first electrode to change the resistance state into the low resistance state.

8. The organic light emitting device according to claim 7, further comprising a current spreading layer which is formed by using CNT (carbon nano tube) or graphene between the organic material layer and the first electrode.

9. The organic light emitting device according to claim 7, further comprising a current spreading layer which formed by using CNT or graphene and is in contact with a surface of the first electrode opposite to a surface of the first electrode which is in contact with the organic material layer.

10. The organic light emitting device according to claim 7, wherein the first electrode is in ohmic contact with the organic material layer.

11. The organic light emitting device according to claim 7, wherein the first electrode is formed by using any one of a transparent oxide based material, a transparent nitride based material, a transparent polymer based material, and a transparent nano material.

12. The organic light emitting device according to claim 7, wherein the organic material layer is configured to include a hole injection layer, a hole transport layer, a light emitting layer, an electron transport layer, and an electron injection layer.

13. A method of manufacturing an organic light emitting device comprising:
- forming a first electrode on a substrate by using a transparent resistance change material of which a resistance state is to be changed from a high resistance state into a low resistance state according to an applied electric field;
- forming an organic material layer including a light emitting layer on the first electrode; and
- forming a second electrode on the organic material layer;
- wherein the transparent resistance change material includes an insulating portion;
- wherein the transparent resistance change material of the first electrode has an inherent threshold voltage at which conducting filaments of the resistance change material are formed through the insulating portion of the resistance change material in the first electrode, and
- wherein, in the forming of the first electrode, the conducting filaments are formed by applying at least the threshold voltage to the first electrode.

14. The method according to claim 13, wherein the forming of the first electrode includes:
- forming a current spreading layer by using CNT or graphene; and
- forming the first electrode on the current spreading layer.

15. The method according to claim 13, wherein the forming of the first electrode includes:
- forming a current spreading layer on the first electrode by using CNT or graphene.

16. The method according to claim 13, wherein the first electrode is in ohmic contact with the organic material layer.

17. The method according to claim 13, wherein the first electrode is formed by using any one of a transparent oxide based material, a transparent nitride based material, a transparent polymer based material, and a transparent nano material.

18. The method according to claim 13, wherein in the forming of the organic material layer, a hole injection layer, a hole transport layer, a light emitting layer, an electron transport layer, and an electron injection layer are sequentially formed.

19. A method of manufacturing an organic light emitting device comprising:
- forming a second electrode on a substrate;
- forming an organic material layer including a light emitting layer on the second electrode; and
- forming a first electrode on the organic material layer by using a transparent resistance change material of which a resistance state is to be changed from a high resistance state into a low resistance state according to an applied electric field;
- wherein the transparent resistance change material includes an insulating portion;
- wherein the transparent resistance change material of the first electrode has an inherent threshold voltage at which conducting filaments of the resistance change material are formed through the insulating portion of the resistance change material in the first electrode, and
- wherein, in the forming of the first electrode, the conducting filaments are formed by applying at least the threshold voltage to the first electrode.

20. The method according to claim 19, wherein the forming of the first electrode includes:
- forming a current spreading layer by using CNT or graphene; and
- forming the first electrode on the current spreading layer.

21. The method according to claim 19, wherein the forming of the first electrode includes:
- forming a current spreading layer on the first electrode by using CNT or graphene.

22. The method according to claim 19, wherein the first electrode is in ohmic contact with the organic material layer.

23. The method according to claim 19, wherein the first electrode is formed by using any one of a transparent oxide based material, a transparent nitride based material, a transparent polymer based material, and a transparent nano material.

24. The method according to claim 19, wherein in the forming of the organic material layer, a hole injection layer, a hole transport layer, a light emitting layer, an electron transport layer, and an electron injection layer are sequentially formed.

* * * * *